United States Patent
Askins et al.

(10) Patent No.: US 6,944,583 B1
(45) Date of Patent: Sep. 13, 2005

(54) MULTI-THREADED FRAME SAFE SYNCHRONIZATION OF A SIMULATION

(75) Inventors: Timothy M. Askins, Mesa, AZ (US); Ronald A. MacCracken, San Jose, CA (US); Randy J. Fox, San Jose, CA (US); Kent O. I. Ohlund, San Jose, CA (US)

(73) Assignee: Centric Software, Inc., San Jose, CA (US)

( * ) Notice: Subject to any disclaimer, the term of this patent is extended or adjusted under 35 U.S.C. 154(b) by 0 days.

(21) Appl. No.: 09/496,563

(22) Filed: Feb. 2, 2000

(51) Int. Cl.[7] ................................................. G06F 9/45
(52) U.S. Cl. ................................. 703/22; 703/6; 703/7
(58) Field of Search ................................. 703/6, 22, 21, 703/13, 7, 8

(56) References Cited

U.S. PATENT DOCUMENTS

| | | | | |
|---|---|---|---|---|
| 5,261,099 A | * | 11/1993 | Bigo et al. | ............... 709/102 |
| 5,301,331 A | * | 4/1994 | Ueno et al. | ............... 710/260 |
| 5,606,365 A | | 2/1997 | Maurinus et al. | |
| 5,678,028 A | * | 10/1997 | Bershteyn et al. | ........... 703/22 |
| 5,701,439 A | | 12/1997 | James et al. | |
| 5,710,894 A | | 1/1998 | Maulsby et al. | |
| 5,752,034 A | * | 5/1998 | Srivastava et al. | ......... 717/130 |
| 5,794,005 A | | 8/1998 | Steinman | |
| 5,819,068 A | | 10/1998 | Hasse | |
| 5,850,538 A | | 12/1998 | Steinman | |
| 5,870,588 A | * | 2/1999 | Rompaey et al. | ............ 703/13 |
| 5,872,958 A | | 2/1999 | Worthington et al. | |
| 5,930,154 A | | 7/1999 | Thalhammer-Reyero | |
| 5,946,474 A | | 8/1999 | Skogby | |
| 5,949,551 A | | 9/1999 | Miller et al. | |
| 5,999,734 A | * | 12/1999 | Willis et al. | ................ 717/149 |
| 6,064,996 A | * | 5/2000 | Yamaguchi et al. | ......... 706/13 |
| 6,086,248 A | * | 7/2000 | Paul et al. | ................. 374/145 |
| 6,088,739 A | | 7/2000 | Pugh et al. | |
| 6,205,465 B1 | * | 3/2001 | Schoening et al. | ......... 718/102 |
| 6,208,953 B1 | * | 3/2001 | Milek et al. | ................... 703/7 |
| 6,300,936 B1 | | 10/2001 | Braun et al. | |
| 6,421,823 B1 | | 7/2002 | Heikes | |
| 6,721,696 B1 | * | 4/2004 | Askins et al. | ................ 703/22 |

OTHER PUBLICATIONS

Rajesh S. Nair, John A. Miller and Zhiwei Ahang, "Java-Based Query Driven Simulation Environment", 1996 Winter Simulation Conference, pp. 786-793.*

Y.M. Deng, S.B. Tor and G.A. Britton, "A Computerized Design Environment for Functional Modeling of Mechanical Products", 1999, ACM Symposium on Solid Modeling and Applications, pp. 1-12.*

(Continued)

Primary Examiner—Kevin J. Teska
Assistant Examiner—Dwin M. Craig
(74) Attorney, Agent, or Firm—Beyer Weaver & Thomas LLP

(57) ABSTRACT

A computer program executes a simulation. The computer program includes a plurality of service programs, where the service programs are configured to collectively determine simulated attributes of objects of an environment under simulated operation. Each service is associated with at least a subset of object attributes in an object database. Furthermore, each service is executing at a rate independent of the other services, and at least some of the services access and operate upon object attributes, from the object database, with which the service is associated. A write queue program is associated with each service, to queue write requests from the service to write determined simulated attributes to the object database. Nodes coordinate execution of the queued requests to cause the determined simulated attributes to be written to the object database in a manner such that each service has a coherent view of all the object attributes.

14 Claims, 6 Drawing Sheets

OTHER PUBLICATIONS

Berry, O. et al., (Jun. 6-7, 1988) "Constructing object-oriented distributed simulations" *Proceedings of 3rd Israel Conference on Computer Systems and Software Engineering,* pp. 117-121.

Comfort, J. C. (Dec. 1991). "Environmental Partitioned Distributed Simulation of Queuing Systems," Proceedings of the Winter Simulation Conference , Dec. 8-11, pp. 584-592.

Hiller, J.B. and Hartrum, T. C. (Jun. 1997). "Conservative Synchronization in Object-Oriented Parallel Battlefield Discrete Event Simulations," Proceedings of the 11th Workshop on Parallel and Distributed Simulation, Jun. 10-13, 1997, pp. 12-19.

Kabata, Y. et al. (Oct. 1999). "An Interactive Modeling Method for Dynamic Natural Objects," *1999 International Conference on Systems, Man, and Cybernetics*, Oct. 12-15, 1999, Toky, Japan, vol. IV, pp. 212-217.

Pawlikowski, K. (Jun. 1990). "Steady-State Simulation of Queueing Processes: Survey of Problems and Solutions," ACM Computing Surveys 22(2):123-170.

\* cited by examiner

MULTI-THREADED FRAME SAFE SYNCHRONIZATION OF A SIMULATION

TECHNICAL FIELD

The present invention relates to simulations and, in particular, to a simulation in which the various aspects of the simulation are executed asynchronously but communicate with each other in a safely synchronized manner.

BACKGROUND

Virtual prototyping solutions can greatly accelerate product development. Obviously, the more accurately a solution simulates "reality", the more confidence one can have in that solution. On the other hand, though, the most useful simulation is typically the one that not only simulates reality faithfully, but also takes the fewest resources to do so.

Whereas reality is continuous in nature, computer simulations are forced to approximate the continuity by acting upon and examining and/or evaluating the simulation model only at discrete points in time. The greater the frequency at which the simulation model is examined, the more accurate is the simulation, since continuity is more closely approached. Thus, conventionally, simulations are designed such that the evaluation rate is high enough to sufficiently approximate reality (i.e., with acceptable error and without noticeable jumps in display), but not so fast that the computer's resources are completely exhausted.

The evaluation rate required depends largely upon the rate at which the simulated events would occur in reality. For example, if modeling the fast-moving parts within an engine, the evaluation rate should be relatively high. On the other hand, modeling the slow buildup of heat within the engine could be carried out at a much slower rate. Furthermore, where visual interaction is important, evaluation for display should be at a relatively high rate if the sensation of interactivity is to be provided to the user.

Since different aspects of a simulation occur with varying evaluation rate requirements, it would be preferable if each aspect executed at a rate most suitable to it. Unfortunately, conventional simulations force the entire simulation to execute at a common frequency. The common frequency is generally faster than required for some aspects of the simulation and perhaps slower than ideally required for other aspects of the simulation. For example, if the calculations of engine heat buildup could only be performed at once or twice a second due to the complexity of the calculations, the calculation of engine part positions could only be performed one or twice a second as well, even though it would be a much simpler calculation. Furthermore, visualization of movement around the engine would be seriously hampered, with position updates at only the once or twice per second rate.

A typical solution to the evaluation rate problem discussed above is to perform the simulation in batch, allowing the user to inspect the results in detail once the simulation is completed. A disadvantage of this approach, however, is that the simulation cannot be interactive.

SUMMARY

In accordance with the invention, a computer program is provided to execute a simulation. The computer program includes a plurality of service program means, where the services are configured to collectively determine simulated attributes of objects of an environment under simulated operation. Each service is associated with at least a subset of object attributes in an object database. Furthermore, each service is executing at a rate independent of the other services, and at least some of the services access and operate upon object attributes, from the object database, with which the service is associated.

A write queue program is associated with each service, to queue write requests from the service to write determined simulated attributes to the object database. Nodes coordinate execution of the queued requests to cause the determined simulated attributes to be written to the object database in a manner such that each service has a coherent view of all the object attributes.

DETAILED DESCRIPTION

Figure 1:
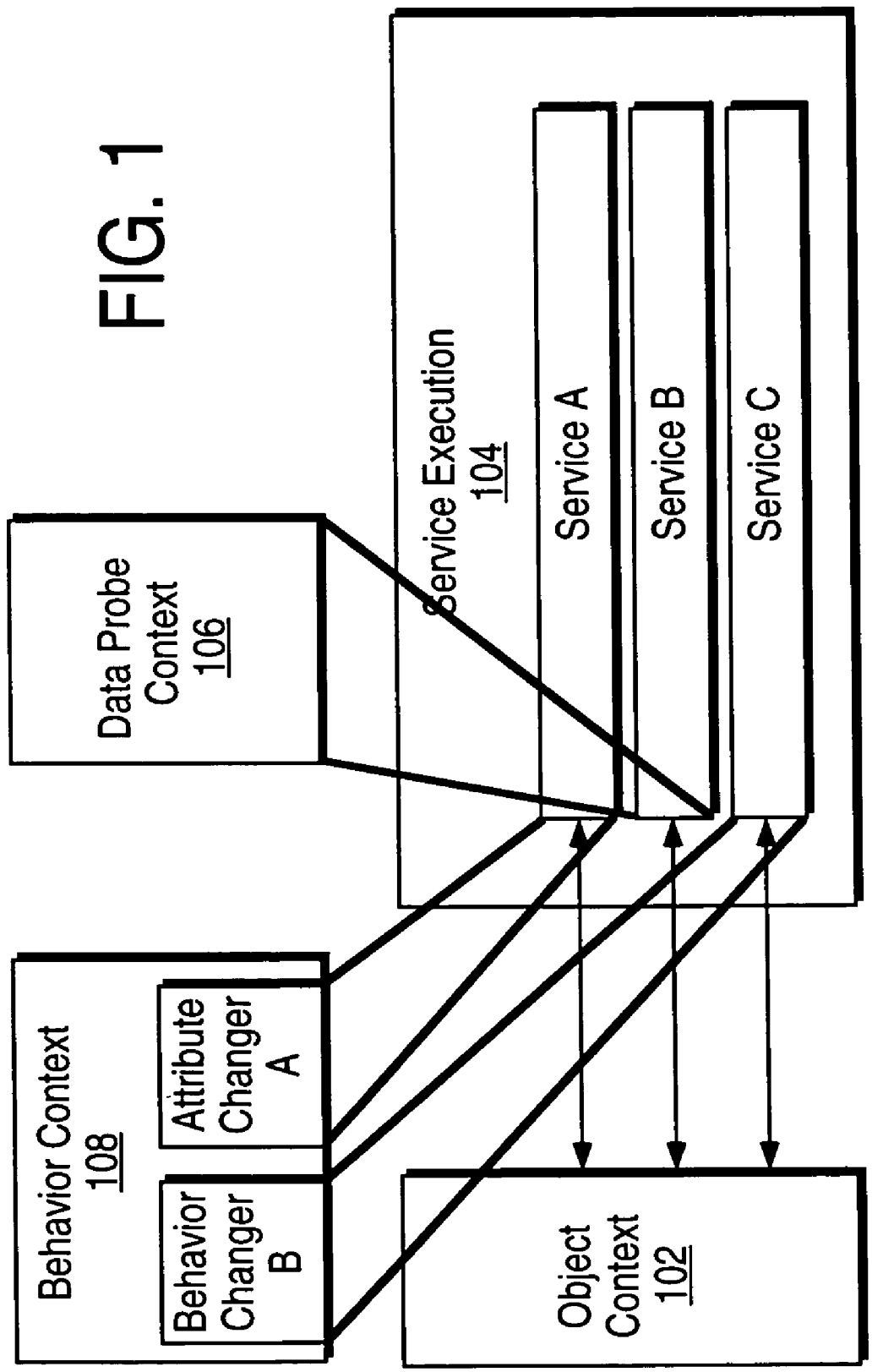
FIG. 1 broadly illustrates a simulation environment 100 in accordance with an embodiment of the invention.

A simulation environment 100 is now described, first broadly with reference to FIG. 1. Block 102 is an object database. The "attributes" of "objects" in the database 102 represent the "state" of the environment being simulated. Block 104 illustrates the execution of "services" (in this case, services A though C) that constitute the active (computational) part of the simulation.

Block 106 illustrates a "data probe context". Input and output data probes are computational objects (implemented as services in the service execution block 104) that provide the simulation user an interface to attributes of objects in the object context 102. Input data probes inject values from some source (e.g., a file or a connection to another application) into attributes of an object during a simulation. Conversely, output data probes examine the values of attributes during a simulation and provide those values to some destination such as a file or a connection to another application. Data probes are described later in greater detail.

Finally, block 108 illustrates a "behavior context". Behavior is the programming employed by a service (in the service execution block 104) that defines how a service is to affect the modeled environment during a simulation. One type of behavior is "logic", which is an event-based state machine description of behavior. Another type of behavior is "mechanism", which is a physics, kinematics-based description of behavior.

Now, the operation of the services execution block 104 is described in greater detail. As alluded to above, services are objects that perform calculations or other functionality repeatedly to accomplish the simulation. Typically, multiple services exist simultaneously and the services each perform their functionality at a particular temporal frequency. Theoretically, the number of services executing at one time is unlimited, although as a practical matter the number of services may be limited by the operating system or by computational performance limitations.

In accordance with an embodiment of the invention, the multiple services operate asynchronously, but data communication among the multiple asynchronously operating services is safely synchronized. This is accomplished even while accommodating the various asynchronous "frame rates" of the services.

To support the multiple "views" of object data required by various services. All objects to which access is required by a service are derived from a "node" base class. The node interacts with services to provide frame safe access to its data members. Each node may maintain multiple "node images" for an object (or for a portion of an object). Each service potentially sees different sets of changes at various times, although all services are ultimately working on the same values. In one embodiment, to minimize the impact on memory, the data duplication occurs at a relatively fine granularity, within objects referred to as "nodes". Nodes are typically relatively small units (portions of object), and data copies are maintained only for those nodes requiring them. Thus, memory duplication is minimized.

In one embodiment, a node does not actually contain attribute data itself. Rather, a node serves as a wrapper to one or more node images that contain the attribute data. While a node image actually contains data, a node includes "frame-safe" methodology to provide the services access the data in the node images. That is, in essence, a node hides the "multi-service issues" from the services. A service that needs to access the value of an object attribute requests the value from or writes the value to, a node corresponding to that object (or to the portion of the object that includes the attribute).

The service passes an ID of the service as an argument to the node. The node uses the ID internally to manage multiple node images it may contain. The node determines which node image is accurate for the requesting service, and creates and deletes node images as needed to maintained the required "clean" copies.

Figure 2:
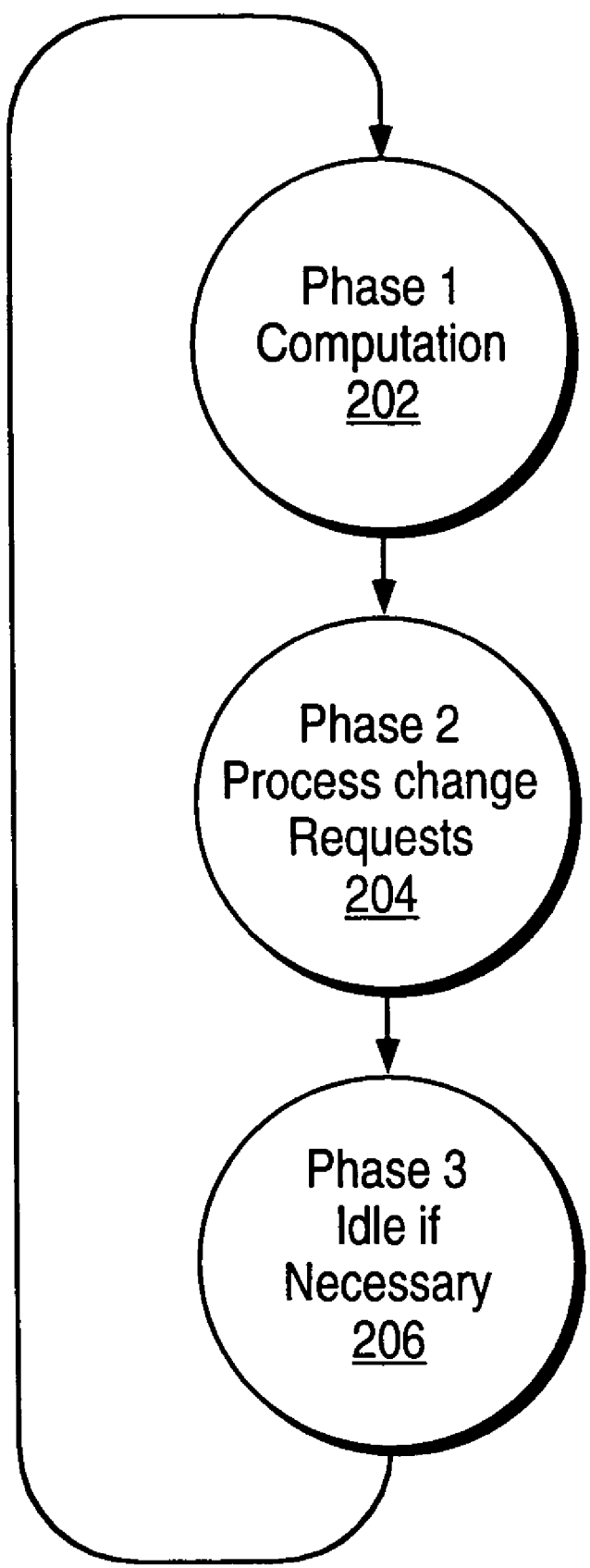
FIG. 2 illustrates processing within a service of the FIG. 1 environment 100.

Before discussing in greater detail how a service accesses node data, though, it is useful to briefly discuss the "phases" of processing that a service executes. FIG. 2 illustrates the processing phases of a typical service. First, the service performs its computations in a computational phase 202. During this computational phase 202, the service queues up (but does not yet process) "change requests". A "change request" is a request to a node to change an attribute of an object represented by the node. Also, during the computational phase 202, the service requests reading of attribute values required for its processing. The requests to read attribute values are not queued but, rather, are processed as part of the computational phase 202.

Next, the service enters a change request processing phase 204 in which it actually processes (or causes to be processed) the change requests queued up during the computational phase 202. In one embodiment, the change request processing by the service consists simply of looping through the queued change requests and passing them to the appropriate nodes for execution. Alternately, the service could notify the nodes (or some other program) that change requests are in its queue for processing.

Finally, if the time period for this frame of the service has not expired by the end of the change request processing phase 204, the service enters an idle phase 206 during which it does nothing substantive until it is time to enter the computational phase 202 again.

Figure 3:
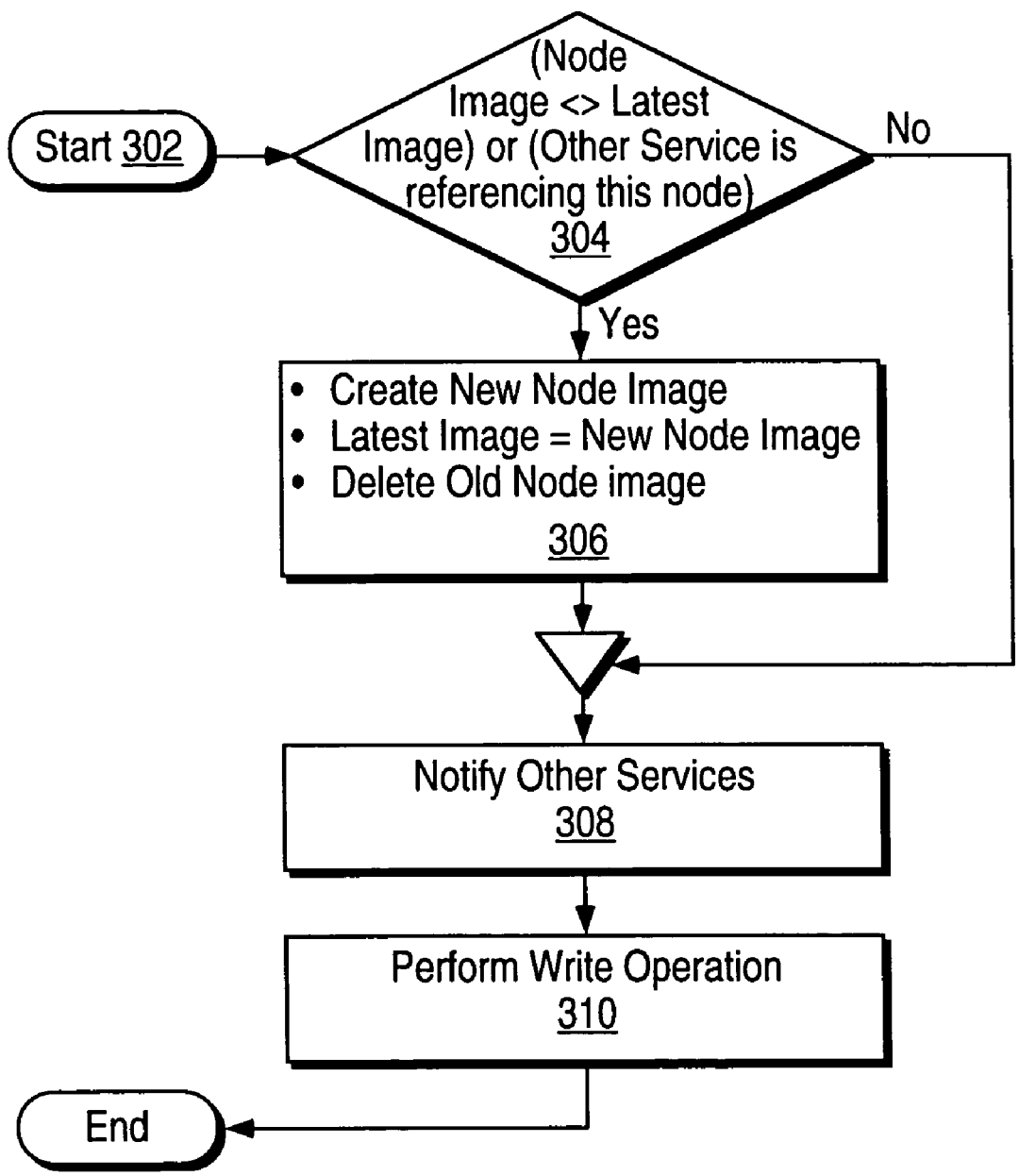
FIG. 3 illustrates how a node change request is handled by a node.

The processing of change requests is now described in greater detail. FIG. 3 illustrates the processing performed by a node in response to a change request passed from a service. After starting (302), at step 304 it is determined if the node image corresponding to the service is the "latest image" or if another service is referencing this node. What is meant by "latest image" is that this node image represents the latest updated state of the object represented by the node. (The process by which a node image becomes the "latest image" is described later.)

If either the node image is the latest image or a service other than the requesting service is referencing the node, then at step 306 a new node image is created. Also, the node records that the latest updated state of the object represented by the node (i.e., "latest image") is this new node image. The old node image is deleted.

Then (or if the determination at step 304 is "NO"), at step 308 other services for which the node is maintaining node images are notified that the "latest image" has changed. At step 310, the requested write operation is made to the node image for the service (whether the "old" node image corresponding to the service or the newly created node image corresponding to the service).

The notification (step 308), and how the notified services react to a notification, is now described. Referring back to FIG. 2, a notification is processed by a service as a "null" change request during the change request processing step 204. In particular, in response to such a notification, the notified service creates a change request for the node for which has been changed by the notifying service. The change request is "null", though, because it does not include data to be written to the object represented by the node. Rather, the change request is a request to make the node image associated with the notified service corresponds to the "latest image" if required.

Figure 4:
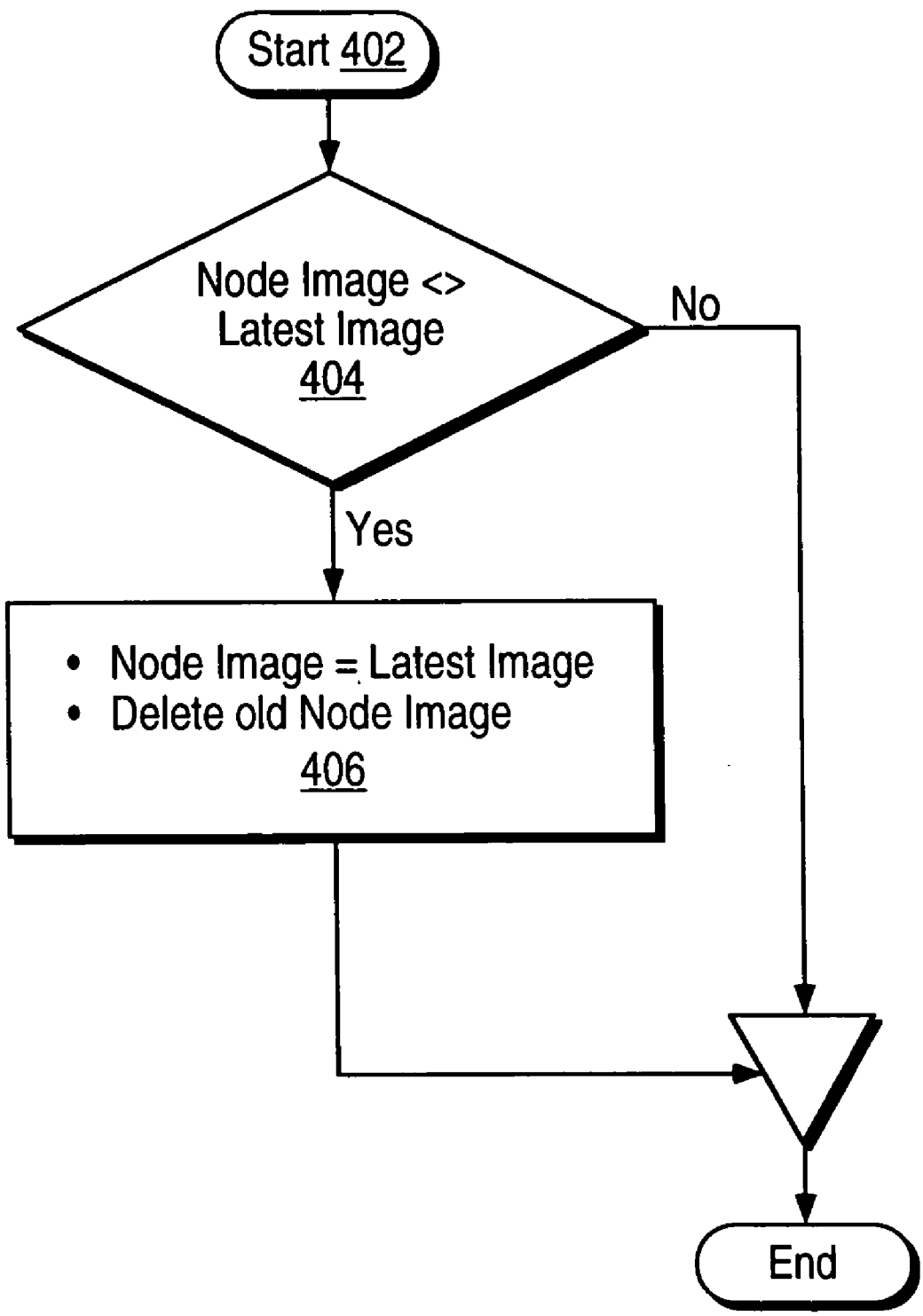
FIG. 4 illustrates how a node processes a request from a service to ensure the service is pointing to the most recently determined value for an object (or portion of an object).

FIG. 4 illustrates how a node processes a "null" change request. First, the processing starts at step 402. At step 404, a determination is made as to whether the node image presently associated with the calling service (i.e., the notified service) is the "latest" node image. If not, then there is no further processing of the "null" change request. If the node image presently associated with the calling service is not the "latest" node image, then the node associates the calling service with the "latest" node and then deletes the "old" node image for the calling service.

Figure 5:
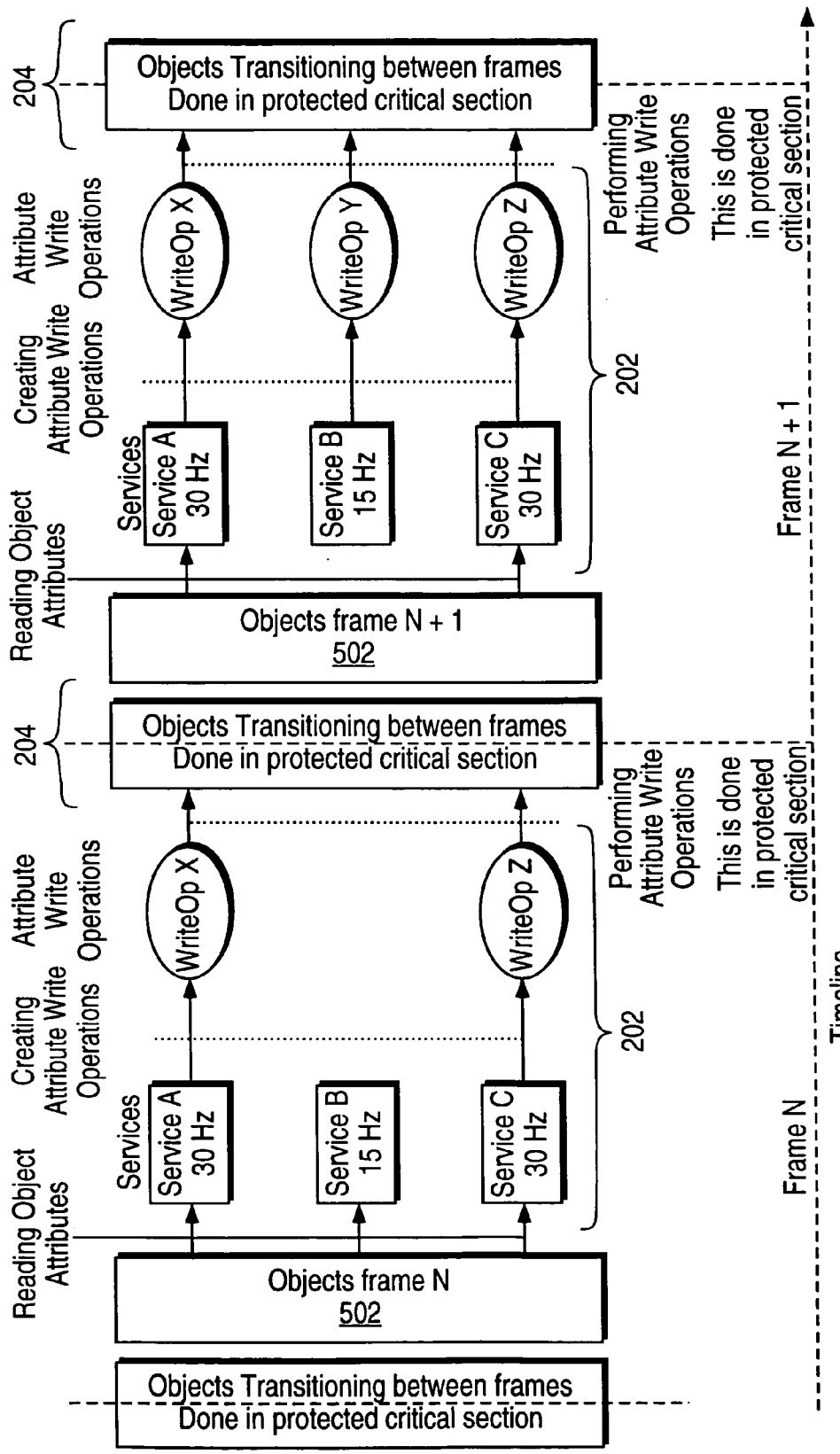
FIG. 5 is a time line that broadly illustrates how services interact.
Figure 6:
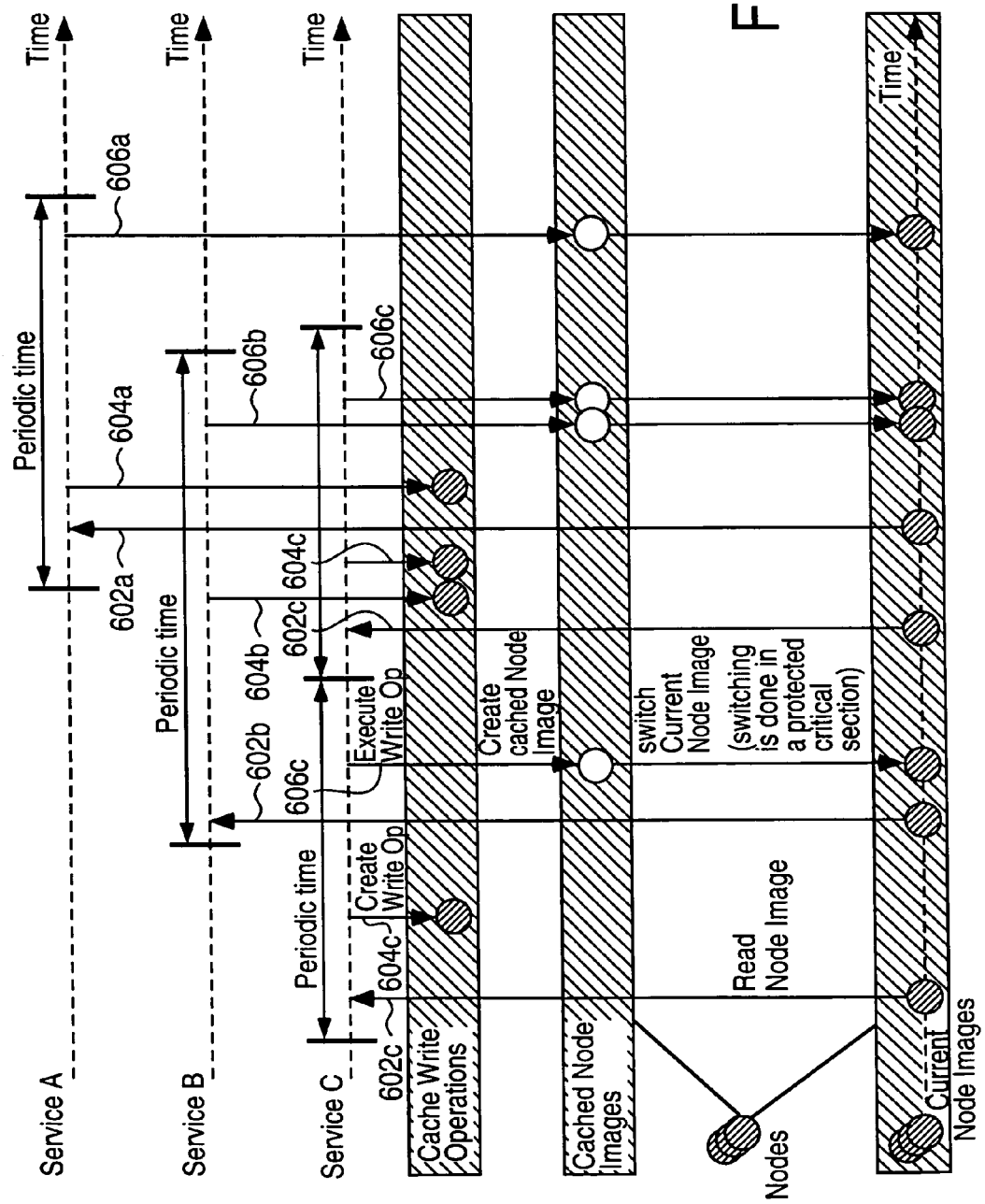
FIG. 6 is a time line that illustrates the interaction between services in greater detail.

Having described the operation of a service in isolation and also how a node reacts to change requests by a service, reference is now made to FIGS. 5 and 6 to describe how services executing in accordance with the previous discussion coexist in apparent synchronicity. FIG. 5 is a timeline that shows how each service executes in its own "frame time". In FIG. 5, the actual time a particular service spends in a frame differs from the time spent in a frame by another service, although this isn't shown in FIG. 5. That is, the services are not synchronized as would appear from FIG. 5 on its face. In fact, though, as is shown later with reference to FIG. 6, it appears to each service that it is in fact operating synchronously with the other services.

Turning now to FIG. 5, and looking at Frame N first, each service reads object attributes from an object "frame context" 502 that appears to that service to be synchronous with the frame execution of the service. (Remembering the previous discussion, this is accomplished in one embodiment by the service generating a read request to a node object, and the node object providing the requested attribute data from a "latest" node image associated with the node.) During its computational phase (202, also shown in FIG. 2), the service queues "change requests" (indicated in FIG. 5 as WriteOp's) to write object attribute data back to the object context 502. After the computational phase, each service processes its queued change requests during a protected critical section by asking the appropriate nodes to perform the changes indicated by the change requests (as shown in FIG. 3). In one embodiment, during the "critical section" for processing a change to a node, the node may not otherwise be accessed, either for read access or for write access. FIG. 5 further illustrates similar processing occurring in Frame N+1.

Now, FIG. 6 is a timeline in "real time" that illustrates how the node processing provides the appearance of synchronization to the services. Taking service A first, it can be seen (as denoted by arrow 602a) that Service A is provided a node attribute (in shorthand, "reads" the attribute, even though such "reading" is via the node object) for processing. At some point later (denoted by arrow 604a), Service A queues a write operation of an object attribute. Yet later (denoted by arrow 606a), during a protected "critical" section of processing, Service A causes (requests) the appropriate node to write the object attribute to an image (the current- or "latest"-image). This is similarly occurring for Service B and Service C, shown in FIG. 6 using the same reference numerals as for Service A but with subscripts B and C, respectively.

That is, Service B reads object attributes (602b); computes on the object attributes and queues write operations of object attributes (604b); and causes the object attributes of the queued write operations to be associated with the current image for the node (606b). A similar processing occurs for Service C (602c, 604c and 606c).

It should be noted that the invention is to be defined by the claims, and not by the embodiment(s) just described.

What is claimed is:

1. A computer program product for use with a computer system to execute a simulation, comprising:
 a plurality of service computer readable program code means, the service program code means configured to collectively determine simulated attributes of objects of an environment under simulated operation wherein the objects are mechanical systems operating in the environment, each service program code means associated with at least a subset of object attributes in an object database and each service program code means executing at a rate independent of the other service program code means wherein the rate is based on the simulated attributes, at least some of the service program code means including computer readable program code means to access and operate upon object attributes, from the object database, with which the service program code means is associated;
 write queue computer readable program code means associated with each service program code means that queues write requests from the service program code means to write determined simulated attributes to the object database; and
 node computer readable program code means that coordinates execution of the queued requests to cause the determined simulated attributes to be written to the object database in a manner such that each service program code means has a coherent view of all the object attributes.

2. The program product of claim 1, wherein the node program code means includes computer readable program code means for creating an image of at least a portion of an object whose attribute is to be written to the object database and for writing the determined simulated attributes to the image; and
 to write the determined simulated attributes of the object to the object database, the node program code means associates the image with the object database.

3. The program product of claim 2, wherein:
 the node program code means associates the image with the object database by changing a pointer for the object in the object database to point to the image.

4. The program product of claim 2, wherein:
 the node code program means includes computer readable program code means for notifying at least some of the service program means that the node program code means is associating an image with the object database.

5. The program product of claim 4, wherein:
 in response to a service program code means receiving an object database association notification from a node program code means, the write queue program code means associated with that service program code means queues a request to the node program means to synchronize that service program code means to the image, and
 the node program code means includes computer readable program code means for synchronizing the service to the image.

6. The program product of claim 1, wherein:
 the service program code means each include a computational phase during which it operates upon the object attributes and during which the write queue program code means queues the write requests generated by the service program code means during the computational phase; and
 the write requests queued for a particular service program code means are processed by the node program code means during a write request processing phase that is outside the computational phase.

7. The program product of claim 4, wherein the at least some of the service program code means which the node program code means notifies includes service program code means that are associated with the object attributes represented by the node image.

8. A method executed by a computer to accomplish a simulation, comprising:
 a plurality of service steps that collectively determine simulated attributes of objects of an environment under simulated operation wherein the objects are mechanical systems operating in the environment, each service step associated with at least a subset of object attributes in an object database and each service step executing at a rate independent of the other service steps wherein the rate is based on the simulated attributes, at least some of the service steps including steps to access and operate upon object attributes, from the object database, with which the service step is associated;
 a write queue computer step associated with each service step that queues write requests from the service step to write determined simulated attributes to the object database; and
 a node step that coordinates execution of the queued requests to cause the determined simulated attributes to be written to the object database in a manner such that each service step has a coherent view of all the object attributes.

9. The method of claim 8, wherein
 the node step includes a step of creating an image of at least a portion of an object whose attribute is to be written to the object database and of writing the determined simulated attributes to the image; and to write the determined simulated attributes of the object to the object database, the node step associates the image with the object database.

10. The method of claim 9, wherein:

the node step associates the image with the object database by changing a pointer for the object in the object database to point to the image.

11. The method of claim 9, wherein:

the node step includes a step of notifying at least some of the service steps that the node step is associating an image with the object database.

12. The method of claim 11, wherein:

in response to a service step receiving an object database association notification from a node step, the write queue step associated with that service step queues a request to the node step to synchronize that service step to the image, and the node step includes a step of synchronizing the service to the image.

13. The method of claim 8, wherein:

the service steps each include a computational phase during which it operates upon the object attributes and during which the write queue step queues the write requests generated by the service step during the computational phase; and the write requests queued for a particular service step are processed by the node step during a write request processing step that is outside the computational step.

14. The method of claim 11, wherein at least one or more of the service steps which have been modified by the node step as recited in claim 11, are associated with the object attributes represented by the node image.

* * * * *